United States Patent
Russell

(10) Patent No.: US 9,674,964 B2
(45) Date of Patent: Jun. 6, 2017

(54) METHOD AND STRUCTURE FOR DIRECTLY CONNECTING COAXIAL OR MICRO COAXIAL CABLES TO THE INTERIOR SIDE OF PADS OF A PRINTED CIRCUIT BOARD TO IMPROVE SIGNAL INTEGRITY OF AN ELECTRICAL CIRCUIT

(75) Inventor: James V Russell, Basking Ridge, NJ (US)

(73) Assignee: Abacus Finance Group LLC, New York, NY (US)

( * ) Notice: Subject to any disclaimer, the term of this patent is extended or adjusted under 35 U.S.C. 154(b) by 1002 days.

(21) Appl. No.: 13/134,259

(22) Filed: Jun. 2, 2011

(65) Prior Publication Data

US 2011/0296678 A1 Dec. 8, 2011

Related U.S. Application Data

(60) Provisional application No. 61/397,170, filed on Jun. 8, 2010.

(51) Int. Cl.
*H05K 3/32* (2006.01)
*H05K 1/02* (2006.01)
*H05K 3/34* (2006.01)
*H05K 3/42* (2006.01)

(52) U.S. Cl.
CPC ............. *H05K 3/32* (2013.01); *H05K 1/0222* (2013.01); *H05K 3/325* (2013.01); *H05K 3/34* (2013.01); *H05K 3/429* (2013.01); *H05K 2201/09481* (2013.01); *H05K 2201/09809* (2013.01); *H05K 2201/10356* (2013.01); *Y10T 29/49124* (2015.01); *Y10T 29/532* (2015.01)

(58) Field of Classification Search
CPC H05K 3/32; H05K 3/34; H05K 3/325; H05K 3/429; H05K 1/0222; H05K 2201/09481; H05K 2201/09809; H05K 2201/10356; H01R 12/51; H01R 13/648; H01R 24/38; Y10T 29/49124
USPC ........................................................ 174/262
See application file for complete search history.

(56) References Cited

U.S. PATENT DOCUMENTS

| | | | |
|---|---|---|---|
| 5,046,966 A * | 9/1991 | Snyder ............. | H01R 13/65802 439/579 |
| 7,091,424 B2 * | 8/2006 | Oggioni et al. .............. | 174/262 |
| 7,180,321 B2 * | 2/2007 | Behziz et al. ........... | 324/756.07 |
| 7,688,092 B2 * | 3/2010 | Mineo et al. ............ | 324/756.07 |
| 2007/0145560 A1* | 6/2007 | Green ........................... | 257/685 |
| 2008/0067637 A1* | 3/2008 | Voutilainen .......... | H05K 1/0243 257/664 |
| 2009/0033347 A1* | 2/2009 | Mineo et al. .................. | 324/754 |
| 2009/0120668 A1* | 5/2009 | Fjelstad ............... | H01R 12/523 174/250 |

* cited by examiner

*Primary Examiner* — Hoa C Nguyen
(74) *Attorney, Agent, or Firm* — Richard B. Klar, Esq; Law Office Richard B Klar

(57) ABSTRACT

A method and an apparatus for connecting a coaxial (or a micro coaxial) cable to the bottom side of a printed circuit board (PCB) in order to improve signal integrity of a test circuit. A coaxial or a micro coaxial cable is directly connected to a coaxial cable to the bottom sides of pads located on an exterior later of the PCB.

20 Claims, 3 Drawing Sheets

METHOD AND STRUCTURE FOR DIRECTLY CONNECTING COAXIAL OR MICRO COAXIAL CABLES TO THE INTERIOR SIDE OF PADS OF A PRINTED CIRCUIT BOARD TO IMPROVE SIGNAL INTEGRITY OF AN ELECTRICAL CIRCUIT

BACKGROUND

1. Field

The present invention relates to a method and apparatus for connecting coaxial (or micro coaxial) cables to the bottom or interior side of pads of an external layer or internal layer of a printed circuit board (PCB) in order to improve signal integrity of an electrical circuit. In particular the present invention relates to a method and apparatus for connecting the center conductor of a coaxial cable to the bottom or interior side of pads located on an exterior layer or interior layer of the PCB, while also connecting the coaxial's ground shielding to a ground or power plane of said PCB.

2. The Related Art

Currently, when high speed signals are routed through PCBs, they suffer from signal integrity issues that are associated with the multiple structures through which the signal passes in the PCB and the poor impedance control the PCB structures afford. The signals pass through 90 degree angles as they transition from the horizontal trace layers through vertical vias and thus create reflections and other unwanted effects. Further, the horizontal traces have rough surfaces due to the manufacturing process of the PCBs. Due to the skin effect, this rough surface of the traces creates a longer path for the current to travel and creates a greater loss with frequency. The PCB manufacturing process has inherent limitations in controlling dielectric thickness and conductor geometries. These limitations create relatively large variations in the characteristic impedance of the transmission line.

In addition, high speed vias through a PCB typically require ground vias surrounding them to provide shielding from adjacent high frequency or power vias which would otherwise create cross talk issues. These additional ground vias create greater routing density issues especially in array patterns such as BGA (Ball Grid array) or LGA (Land Grid Array). The same cross talk issues plague horizontal traces on the PCB as well.

It would be desirable to provide a method and structure for connecting a coaxial or micro coaxial cable directly to the interior side of pads in the PCB that avoids the aforementioned drawbacks.

SUMMARY

Thus it would be desirable to provide a method and structure that would eliminate the 90 degree transitions that occur when signals pass through the 90 degree angles as they transition from the horizontal trace layers through vertical vias resulting in reflections and other unwanted effects. In addition, it would be desirable to provide a method and structure that suffers less loss from skin effect, eliminates or minimizes interconnect transitions, has tighter impedance control, improved routing densities, particularly in array patterns, and high density areas and reduces cross talk in vias and horizontal traces.

This is accomplished by providing a method and a structure in which a coaxial or a micro coaxial cable is directly connected to the bottom or interior side of a pad on the exterior or interior layer of a printed circuit board to improve signal integrity for an electrical circuit in which the structure can be either a one layer or else a two or more layer printed circuit board (PCB) having a formed opening therein in which either a coaxial or micro coaxial cable is threaded or placed through the formed opening of the PCB so that a center conductor of the cable extends to an outer or inner conductor layer of the PCB opposite its entry side of said opening; the outer shielding of the coaxial cable being connected to one or more internal metal layers of said PCB to provide said cable with a connection to a ground or power plane or planes of the PCB; and the center conductor being attached to a bottom or interior side of an exterior or interior pad of the PCB. It is understood that the center conductor and the ground shielding of said coaxial cable can be connected to the corresponding metal of said PCB by solder, conductive epoxy, metallic plating, friction fit or any other method known in the art.

BRIEF DESCRIPTION OF THE DRAWINGS

FIGS. 3-5 illustrate another embodiment of the present invention in which:

FIG. 3 shows a technique using either a cage of ground vias (FIG. 4) or a ground trench (FIG. 5) placed around the coaxial center conductor extending the ground reference on the layer below and up to the plane where a trace enters the coaxial area and the trace attaches to the coaxial center conductor pad;

FIG. 4 is a top view of one possible embodiment of FIG. 3 showing a cage of vias placed around the signal pad 9; and FIG. 5 is an alternative embodiment to the embodiment of FIG. 4 where instead of a cage of ground vias, a ground trench extends around the signal pad 9.

DETAILED DESCRIPTION OF THE PREFERRED EMBODIMENT(S)

Figure 1:
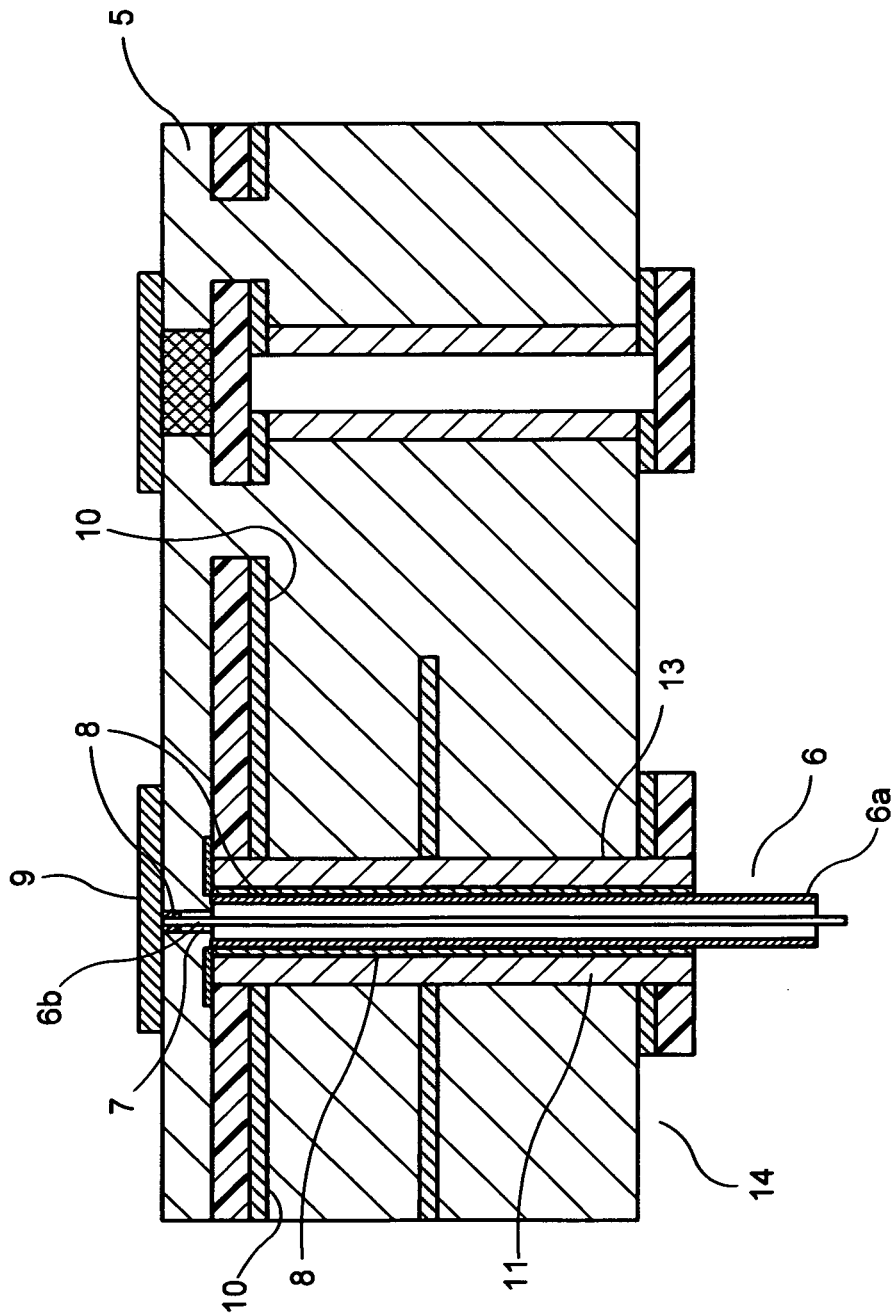
FIG. 1 is a sectional view of a first embodiment of the present invention in which a coaxial or micro coaxial cable extends through an opening in a PCB and conductive plating is provided in the opening through which the cable extends and the plating may be connected to internal or external ground or power plane or planes as well as internal or external pads.
Figure 2:
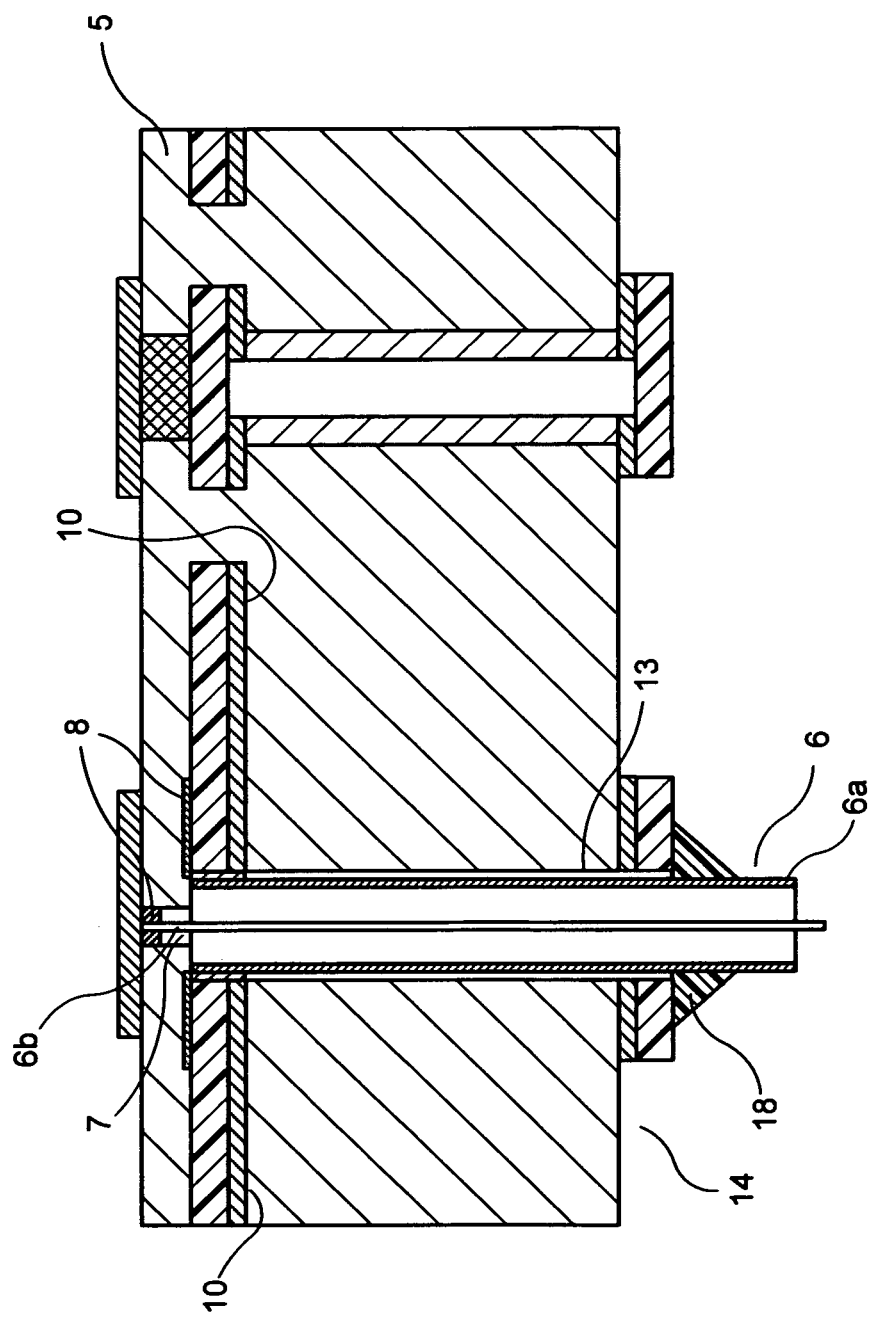
FIG. 2 is a sectional view of a second embodiment of the present invention in which a coaxial or micro coaxial cable extends through an opening in a PCB and no conductive plating is provided in the opening through which the cable extends.

Referring now to the drawings of FIGS. 1 and 2 as can be seen in both drawings, an opening 13 is formed in either a one layer or else a two or more layer printed circuit board (PCB) 5 and a coaxial or micro coaxial cable 6 is threaded or placed through said opening 13 of the PCB 5 so that the center conductor 6b of the cable 6 extends to the outer conductor layer pad 9 of the PCB 5. The outer shielding 6a of the coaxial cable 6 is then connected to one or more internal metal layers of the PCB 5 which ideally would be a ground or power plane or planes 10. It is understood that the opening 13 could be a plated hole that picks up a ground plane from any internal layer or layers of the PCB 5, and the outer shielding 6a would be attached to the plating in the openings. It is further understood that the shielding can be attached either by solder, conductive epoxy, metallic plating, friction fit, or any other method known in the art.

In the embodiment of FIG. 1, a coaxial or micro coaxial cable extends through an opening in a PCB and conductive plating is provided through the opening in which the cable extends. In the embodiments of FIG. 2 conductive plating is not provided in the formed opening.

The center conductor 6b of the coaxial cable 6 can either be flush to the outer shielding 6a of the cable 6 or ideally extending beyond the outer shielding end point. This center conductor 6b is then attached to the interior side of a pad of the PCB 5 through an opening in the dielectric 7 (also the center conductor opening 7) between the exterior layer and the balance of the PCB 5. The pad can be either an exterior pad or an interior pad of the PCB 5. The center conductor 6b is attached to the bottom of said pad with solder, conductive epoxy, metallic plating 8, friction fit, or any other method known in the art. The ground shielding 6a is attached to the via plating 11 with solder, conductive epoxy, metallic plating 8, or any other method known in the art. Conversely, the ground connection 6a or the signal connection 6b could rely on a pressure or friction contact to corresponding metal on PCB 5 to rely on its electrical contact. Further, the epoxy from the PCB manufacturing process can be relied upon to anchor the cable in place or epoxy 18 (see FIG. 2) can be added to the formed opening and the cables entry point to further ensure reliability. The present invention also includes embodiment in which the shielding of the coaxial cable is electrically isolated from the ground or power planes 10 of the PCB 5.

The opposite end of the coaxial cable is then free to extend beyond the end of the PCB 5 and is free to be attached to another electrical component.

Figure 3:
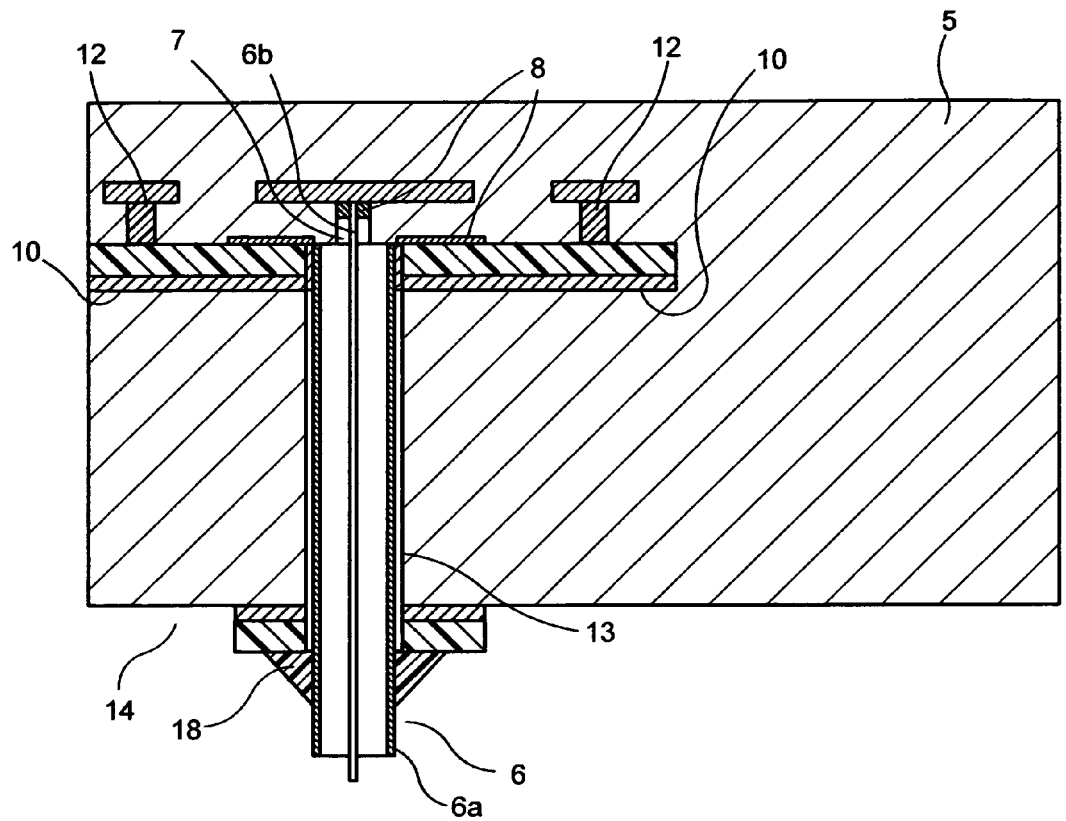
Figures 4, 5:
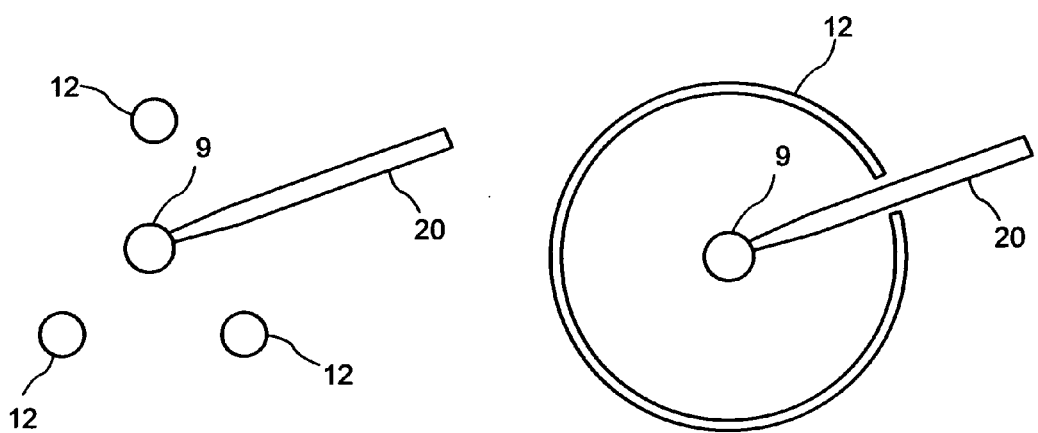

The description and drawings of embodiments of FIGS. 3-5 of this application are the same as referenced in Applicant's co-pending patent application Ser. No. 12/798,217 and are incorporated herein by reference thereto as if written herein.

FIG. 3 illustrates a method and a structure extending the ground reference of the coaxial cable 6 up to the geometric plane at which the coaxial's center conductor 6b attaches to the pad 9 of PCB 5. Signal integrity is improved by providing ground shield up to the corresponding plane at which the PCBs pad 9 resides. The ground shielding can be implemented by either providing ground cage vias (FIG. 4) with ground vias 12 (FIG. 3) around a center conductor 6b of coaxial 6 up to the pad 9 layer or else by a ground trench 12 (FIG. 5) formed in a semi-circle around the center conductor opening 7.

Both FIGS. 4 & 5 provide open area between the cage or semi-circle ends points to allow trace routing on the pad 9 layer. In the embodiments described in FIGS. 3-5, the center conductor 6b as well as the ground vias or trench 12 can be connected to the pad layer through openings in the dielectric either by metallically plating, solder, conductive epoxy, pressure or friction fit or by any method known in the art.

FIG. 4 describes the first embodiment for the present disclosure where a cage of ground vias is placed around the signal pad 9. FIG. 3 is a top view illustration. It is understood that some of the ground vias 12 can be at different heights for different layers in the structure if desired to raise the signal to higher levels. Thus the ground vias 12 are placed around the center conductor opening 7 extending the ground reference on the layer below and up to the plane (and layer) at which the trace 20 attaches to pad 9.

FIG. 5 is a second embodiment where instead of a cage of ground vias, a ground trench 12 in the shape of a semi-circle extends around the center conductor opening 7. The trench 12 extends a method and a structure where a ground reference is provided that extends for the entire length of the center conductor opening 7 from the plane where the trace 20 attaches to pad 9 and down to the ground reference of the layer below. It is understood that if no pad is intended to attach to pad 9 the semi circularly shaped trench 12 can be formed as a complete circle.

It is understood that the present invention is not limited to either of these two non-limiting exemplary embodiments of the present invention.

While presently preferred embodiments have been described for purposes of the disclosure, it is understood that numerous changes in the arrangement of apparatus parts can be made by those skilled in the art. Such changes are encompassed within the spirit of the invention as defined by the appended claims.

What is claimed:

1. A structure for attaching a coaxial or a micro coaxial cable to an interior a side of an exterior pad of a printed circuit board to improve signal integrity for an electrical circuit, comprising:

a one layer or else a two or more layer printed circuit board (PCB) having a formed opening having an entry side therein in which either a coaxial or micro coaxial cable is placed through the formed opening of the PCB so that a center conductor of said cable extends to or near an outer conductor layer of said exterior pad of the PCB where the entry side of said opening is located, said coaxial cable having an outer shielding and said outer shielding is free from any encasement within said opening other than said opening to reduce an effect of cross talk and ground shielding is attached to via plating to bottom of a pad below said PCB; and said center conductor extends vertically upright to attach and is either attached to an interior side of said exterior pad of the PCB on a side where said entry side is located or has a pressure or friction contact to a corresponding metal on the PCB to provide a ground connection or signal connection for relying on its electrical contact.

2. The structure according to claim 1 wherein said center conductor is attached to said interior side of said exterior pad of said PCB by soldering.

3. The structure according to claim 1 wherein said center conductor is attached to said interior side of said exterior pad of said PCB by metallic plating.

4. The structure according to claim 1 wherein said center conductor is attached to said interior side of said exterior pad of said PCB by conductive epoxy.

5. The structure according to claim 1 wherein said center conductor is attached to said interior side of said exterior pad of said PCB by friction fit.

6. The structure according to claim 1 wherein said opening has plating for connecting to ground or power planes.

7. The structure according to claim 1 further comprising said outer shielding of the coaxial cable being connected to one or more internal metal layers of said PCB to provide a connection to a ground or power plane or planes.

8. The structure of claim 1 further comprising said outer shielding of the coaxial cable being isolated from one or more internal metal layers of said PCB to prevent attachment to a ground or power plane or planes of the PCB.

9. The structure according to claim 1 further comprising ground vias placed around the center conductor opening extending a ground reference on the layer below the PCB and up to a plane and layer at which a trace enters a coaxial signal pad.

10. The structure according to claim 1 further comprising a ground trench placed around the center conductor opening extending a ground reference on the layer below of the PCB and up to a plane and layer at which a trace enters a coaxial signal pad.

11. The structure according to claim 1 wherein said center conductor is attached to said interior pad of said PCB by friction fit.

12. A structure for attaching a coaxial or a micro coaxial cable to an interior a side of an interior pad of a printed circuit board to improve signal integrity for an electrical circuit, comprising:

a one layer or else a two or more layer printed circuit board (PCB) having a formed opening having an entry side therein in which either a coaxial or micro coaxial cable is placed through the formed opening of the PCB so that a center conductor of said cable extends to or near said interior pad of the PCB where the entry side of said opening is located, said coaxial cable having an outer shielding and said outer shielding is free from any encasement within said opening other than said opening to reduce an effect of cross talk and ground shielding is attached to via plating to bottom of a pad below said PCB to reduce an effect of cross talk; and said center conductor is either extends vertically upright and attaches to a side of said interior pad of the PCB on a side where said entry side is located or has a pressure or friction contact to a corresponding metal on the PCB to provide a ground connection or signal connection for relying on its electrical contact.

13. The structure according to claim 12 wherein said center conductor is attached to said interior pad of said PCB by soldering.

14. The structure according to claim 12 wherein said center conductor is attached to said interior pad of said PCB by metallic plating.

15. The structure according to claim 12 wherein said center conductor is attached to said interior side of said interior pad of said PCB by conductive epoxy.

16. The structure according to claim 12 wherein said opening has plating for connecting to ground or power planes.

17. The structure according to claim 12 further comprising said outer shielding of the coaxial cable being connected to one or more internal metal layers of said PCB to provide a connection to a ground or power plane or planes.

18. The structure of claim 12 further comprising said outer shielding of the coaxial cable being isolated from one or more internal metal layers of said PCB to prevent attachment to a ground or power plane or planes of the PCB.

19. The structure according to claim 12 further comprising ground vias placed around the center conductor opening extending a ground reference on the layer below of the PCB and up to a plane and layer at which a trace enters a coaxial signal pad.

20. The structure according to claim 12 further comprising a ground trench placed around the center conductor opening extending a ground reference on the layer below of the PCB and up to a plane and layer at which a trace enters a coaxial signal pad.

\* \* \* \* \*